(12) United States Patent
Park et al.

(10) Patent No.: US 7,227,207 B2
(45) Date of Patent: Jun. 5, 2007

(54) DENSE SEMICONDUCTOR FUSE ARRAY (75) Inventors: Byeongju Park, Poughkeepsie, NY (US); Chandrasekharan Kothandaraman, Hopewell Junction, NY (US); Subramanian S. Iyer, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,718

(22) Filed: Mar. 3, 2005

(65) Prior Publication Data
US 2006/0197179 A1 Sep. 7, 2006

(51) Int. Cl.
*H01L 31/062* (2006.01)
*H01L 31/113* (2006.01)

(52) U.S. Cl. .................. 257/292; 257/209; 257/529

(58) Field of Classification Search ........... 257/209, 257/529, E23.149; 438/132, 215, 281, 333, 438/601; 315/294; 361/534
See application file for complete search history.

(56) References Cited
U.S. PATENT DOCUMENTS

| | | | |
|---|---|---|---|
| 4,254,428 A | 3/1981 | Feth et al. | |
| 4,518,981 A | 5/1985 | Schlupp | |
| 4,908,679 A | 3/1990 | Vora et al. | |
| 4,910,418 A | 3/1990 | Graham et al. | |
| 5,059,555 A | 10/1991 | Iranmanesh et al. | |
| 5,150,016 A * | 9/1992 | Sawase et al. | 315/294 |
| 5,150,116 A * | 9/1992 | Sawase et al. | 315/294 |
| 5,478,764 A | 12/1995 | Inoue | |
| 5,536,968 A | 7/1996 | Crafts et al. | |
| 5,808,351 A * | 9/1998 | Nathan et al. | 257/528 |
| 5,813,881 A * | 9/1998 | Nathan et al. | 439/516 |
| 5,882,998 A | 3/1999 | Sur, Jr. et al. | |
| 6,008,523 A * | 12/1999 | Narayan et al. | 257/529 |
| 6,501,107 B1 | 12/2002 | Sinclair et al. | |
| 6,670,824 B2 | 12/2003 | Goodbread et al. | |
| 2004/0140512 A1 | 7/2004 | Saggio et al. | |
| 2005/0212080 A1* | 9/2005 | Wu et al. | 257/529 |

* cited by examiner

*Primary Examiner*—Andy Huynh
*Assistant Examiner*—Tram Hoang Nguyen
(74) *Attorney, Agent, or Firm*—Mark R. Bilak; Joseph P. Abate (57) ABSTRACT

The present invention provides a dense semiconductor fuse array having common cathodes. The dense semiconductor fuse array of the present invention occupies less area than conventional semiconductor fuse arrays, can comprise integrated diodic components, and can require only one metal wiring layer for making electrical connections to the fuse array.

9 Claims, 10 Drawing Sheets

DENSE SEMICONDUCTOR FUSE ARRAY

BACKGROUND OF THE INVENTION

The present invention relates to semiconductor structures, and particularly, to dense semiconductor fuse arrays having common cathodes.

Electrically operable fuses are utilized within the field of integrated circuit devices and processes for a number of purposes, including programming alterable circuit connections, or replacing defective circuit elements with redundant circuit elements. Electrically operable fuses are typically arranged in an array. Such fuse arrays typically comprise a number of fuses where each fuse can be individually selected and programmed. By activating a particular row and column of the fuse array, an individual fuse can be selected and programmed by driving sufficient current through the fuse, thereby causing it to heat up and eventually break. Once the fuse breaks, it can no longer pass current and is considered "programmed."

Figure 1:
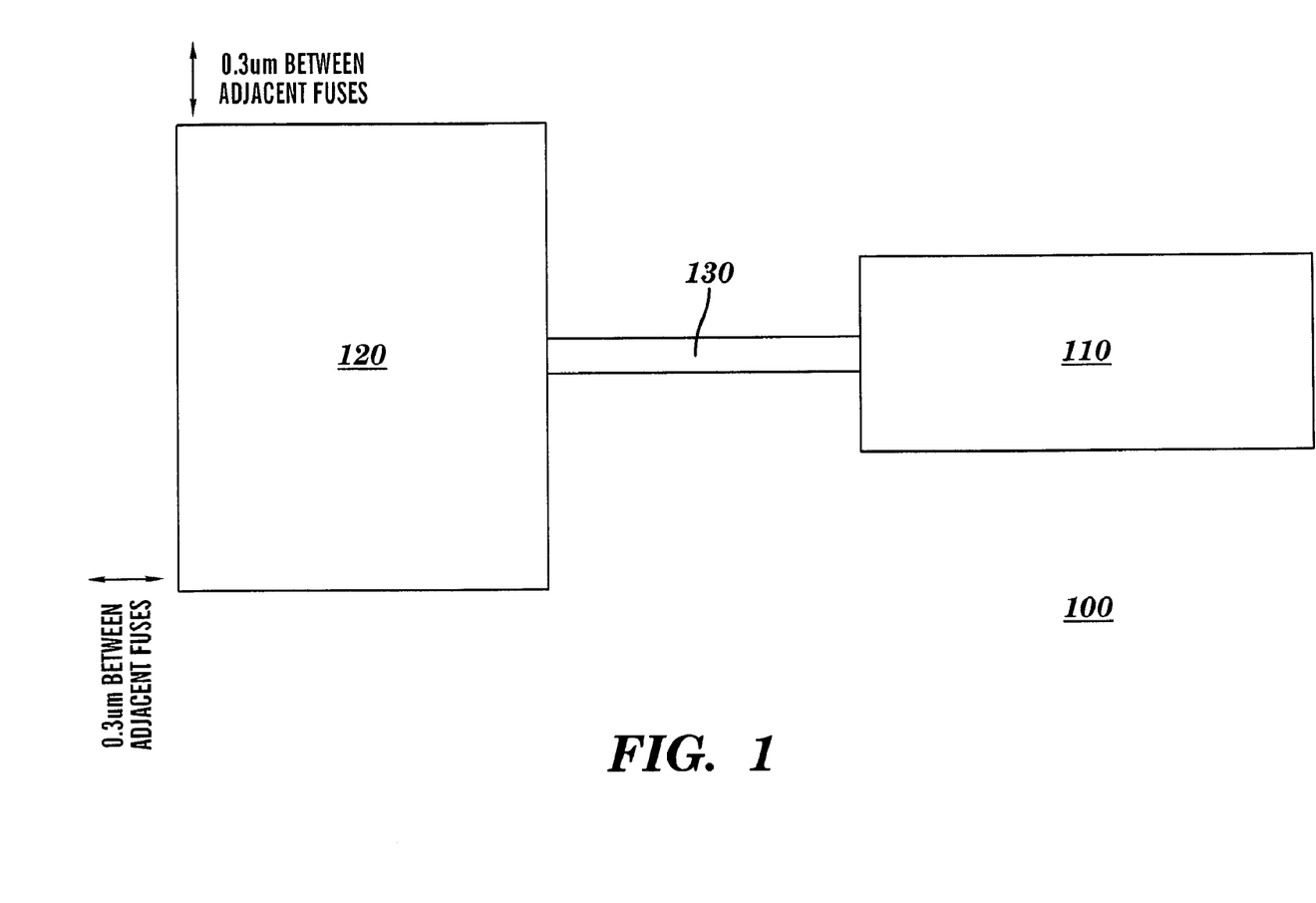
FIG. 1 is a diagram illustrating a conventional semiconductor fuse.

FIG. 1 illustrates a conventional fuse 100. Fuse 100 comprises anode 110, cathode 120 and fuse link 130. Fuse 100 is typically formed from polysilicon. Cathode 110 can be approximately 1.38 um wide and 1.7 um long. Anode 120 can be approximately 0.68 um wide and 1.73 um long. Fuse link 130 can be approximately 0.12 um wide and 1.2 um long. Fuse link 130 is the component of fuse 100 that can be programmed. When a sufficient amount of current flows from anode 110 to cathode 120, fuse link 130 heats up and breaks. Adjacent fuses must be separated by a minimum amount of space (i.e. ground rule spacing) to ensure proper function, for example, a separation of 0.3 um between adjacent fuses can be sufficient.

Figure 2:
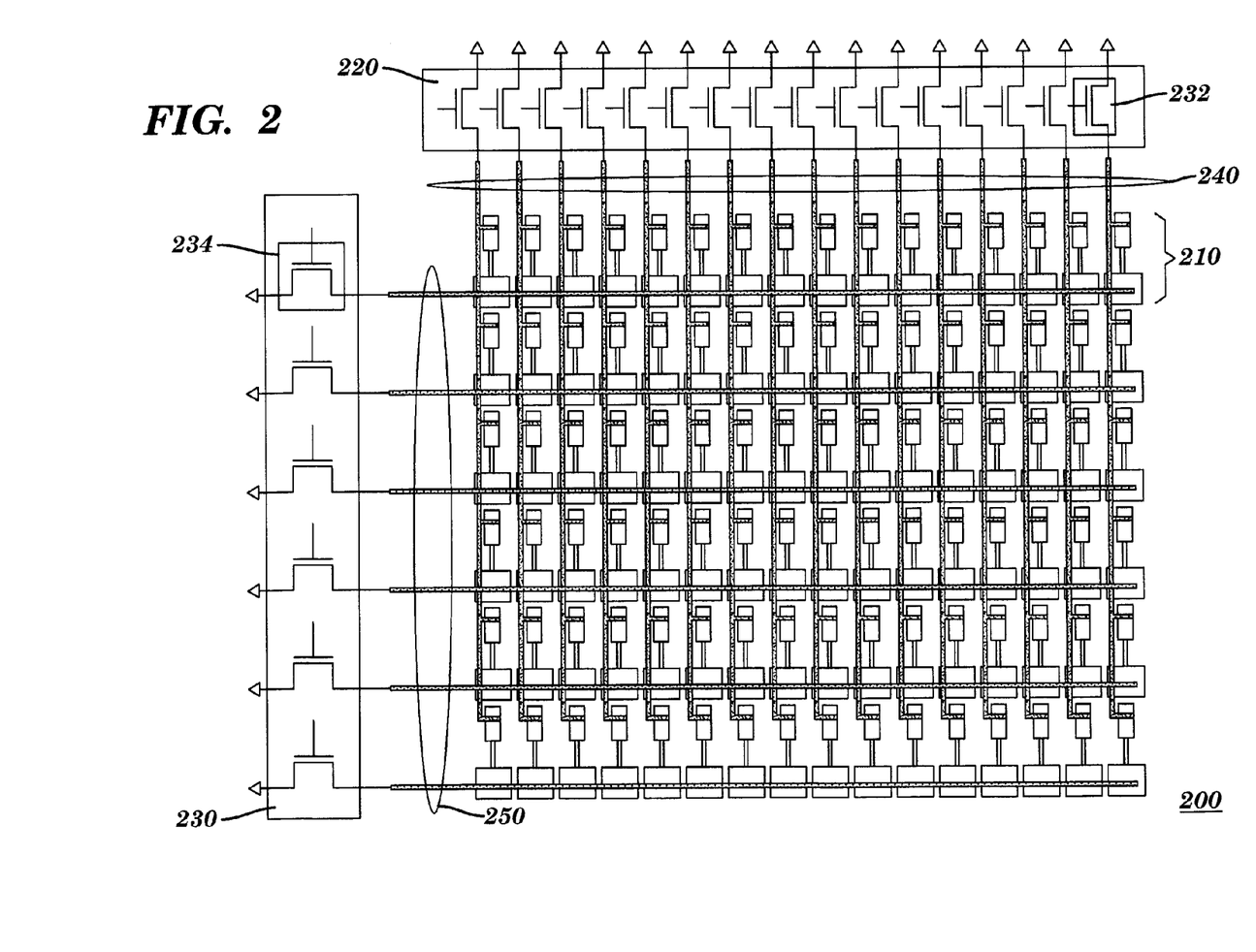
FIG. 2 is a diagram illustrating a conventional semiconductor fuse array.

FIG. 2 illustrates a conventional fuse array 200. Array 200 can comprise a plurality of fuses, each fuse being of the kind as previously described. As illustrated in FIG. 2, fuse array 200 is a 6×16 array (six rows by sixteen columns). Each fuse can be individually selected and programmed by activating the appropriate transistor within anode access circuit 220 and the appropriate transistor within cathode access circuit 230. For example, fuse 210 can be selected and programmed by activating anode access transistor 232 and cathode access transistor 234. For example, when cathode access transistor 234 provides ground potential to the cathode of fuse 210 and anode access transistor 232 provides some voltage potential above or below ground to the anode of fuse 210, current will flow through fuse 210, causing it to be programmed as previously described. Sense circuitry (not shown) can detect whether each individual fuse has been programmed.

Conventional fuse arrays like the one illustrated in FIG. 2 have several drawbacks. First, conventional fuse arrays are not efficiently area-optimized. In other words, conventional fuse arrays are not as densely arranged as possible, thereby negatively impacting the overall size of circuit designs that incorporate such arrays. For example, a conventional 6×16 fuse array of the kind illustrated in FIG. 2 having fuses of the kind illustrated in FIG. 1 has a total area of 883.2 um$^2$ (9.2 um$^2$ per fuse).

Additionally, conventional fuse arrays consisting of purely resistive fuse elements suffer from secondary currents that flow through a network of wires around the selected fuse. The secondary currents make the programming and sensing of individual fuses difficult. Therefore, a diodic fuse element that can limit the current in one direction is desired.

Also, conventional fuse arrays require two metal wiring levels for contacting the anode and cathode of each fuse. For example, as illustrated in FIG. 2, a first metal wiring layer 240 is required to form electrical connections between anode access circuit 220 and the anodes of each fuse (e.g. column lines) and a second metal wiring layer 250 is required to form electrical connections between cathode access circuit 230 and the cathodes of each fuse (e.g. row lines). The wiring levels must be insulated from one another to ensure proper function of the fuse array.

Therefore, a need exists for a dense fuse array having diodic fuse elements.

BRIEF SUMMARY OF THE INVENTION

The present invention addresses the above-described problems by providing a dense semiconductor fuse array having common cathodes. Common cathodes improve array density. Also, depending on the fuse type, common cathodes can eliminate the need for an additional metal wiring layer. In accordance with one aspect of the invention, a dense semiconductor fuse array is provided having a plurality of column lines, a plurality of common cathodes, and a plurality of fuse elements where multiple fuse elements share a common cathode. Furthermore, each fuse of the dense semiconductor fuse array can comprise a diode for preventing secondary current paths. The diodes can be integrated into the fuse structures.

In accordance with another aspect of the invention, a circuit, such as a programmable circuit, for example a PROM (Programmable Read Only Memory), is provided having a semiconductor substrate and a dense semiconductor fuse array where the fuse array comprises a plurality of column lines, a plurality of common cathodes, and a plurality of fuse elements where multiple fuse elements share a common cathode.

In accordance with yet another aspect of the invention, the dense semiconductor fuse array comprising common cathodes further has row and column access circuitry for selecting individual fuses for either programming or sensing fuses.

Further embodiments for a dense semiconductor fuse array having common cathodes include the fabrication of the dense fuse array on a silicon-on-insulator (SOI) substrate, for example, the formation in a silicon substrate having a buried insulator layer, e.g., a buried oxide (BOX) layer.

DETAILED DESCRIPTION OF PREFERRED EMBODIMENTS OF THE INVENTION

Figure 3:
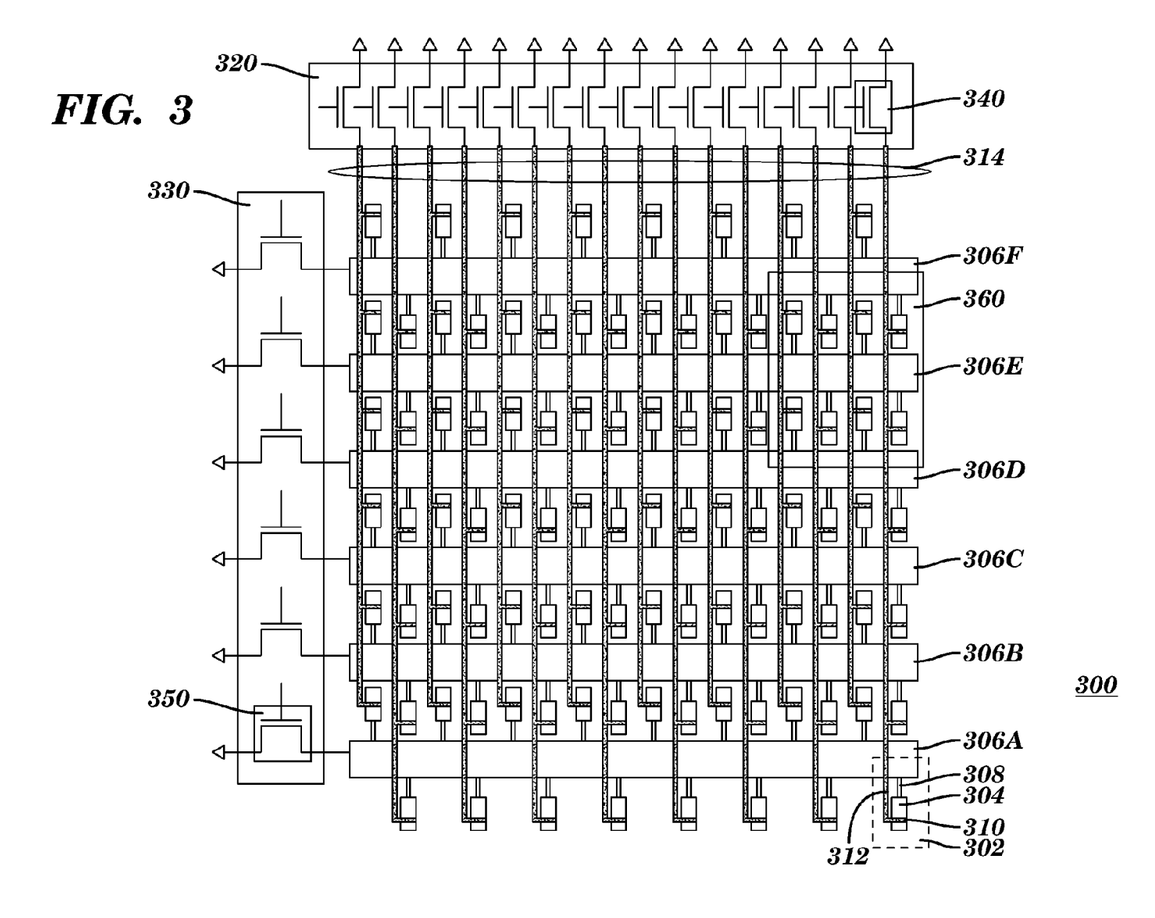
FIG. 3 is a diagram illustrating a dense semiconductor fuse array according to an embodiment of the present invention.

FIG. 3 illustrates a top-down view of the dense semiconductor fuse array according to an embodiment of the present invention. Dense semiconductor fuse array 300 is formed on a semiconductor substrate (not shown). The semiconductor substrate can comprise any suitable semiconductor material such as bulk silicon, silicon-on-insulator ("SOI"), SiGe, GaAs, or the like. For illustrative purposes only, dense semiconductor fuse array 300 is a 6×16 fuse array (six row lines by sixteen column lines). The dense semiconductor fuse array of the present invention can comprise any suitable number of row and column lines. Located at the intersection of each row and column line of dense fuse array 300 is a fuse. Each fuse comprises an individual anode, a common (i.e. shared) cathode, and an individual fuse link. For example, at the intersection of the sixth row line and the sixteenth column line of dense fuse array 300 is fuse 302. Fuse 302 comprises anode 304, common cathode 306A, and fuse link 308.

Anode 304 is not shared by any other fuse and preferably comprises polysilicon. Alternatively, anode 304 can comprise any suitable material such as amorphous polysilicon, amorphous silicon, epitaxial silicon, silicon germanium alloy in any phase, or the like. Alternatively, a silicide can be formed on the underlying anode material to increase the conductivity of the fuse. The silicide, or silicide-germanide alloy, can comprise any suitable metal such as tungsten, cobalt, titanium, tantalum, nickel, or the like. Common cathode 306A is a contiguous conducting layer that is shared by multiple fuses. Preferably, common cathode 306A comprises polysilicon. Alternatively, common cathode 306A can comprise any suitable material such as amorphous silicon, epitaxial silicon, silicon germanium alloy in any phase, or the like. Alternatively, a silicide can be formed on the underlying common cathode material to increase the conductivity of the fuse. The silicide, or silicide-germanide alloy, can comprise any suitable metal such as tungsten, cobalt, titanium, tantalum, nickel, or the like.

Figure 4:
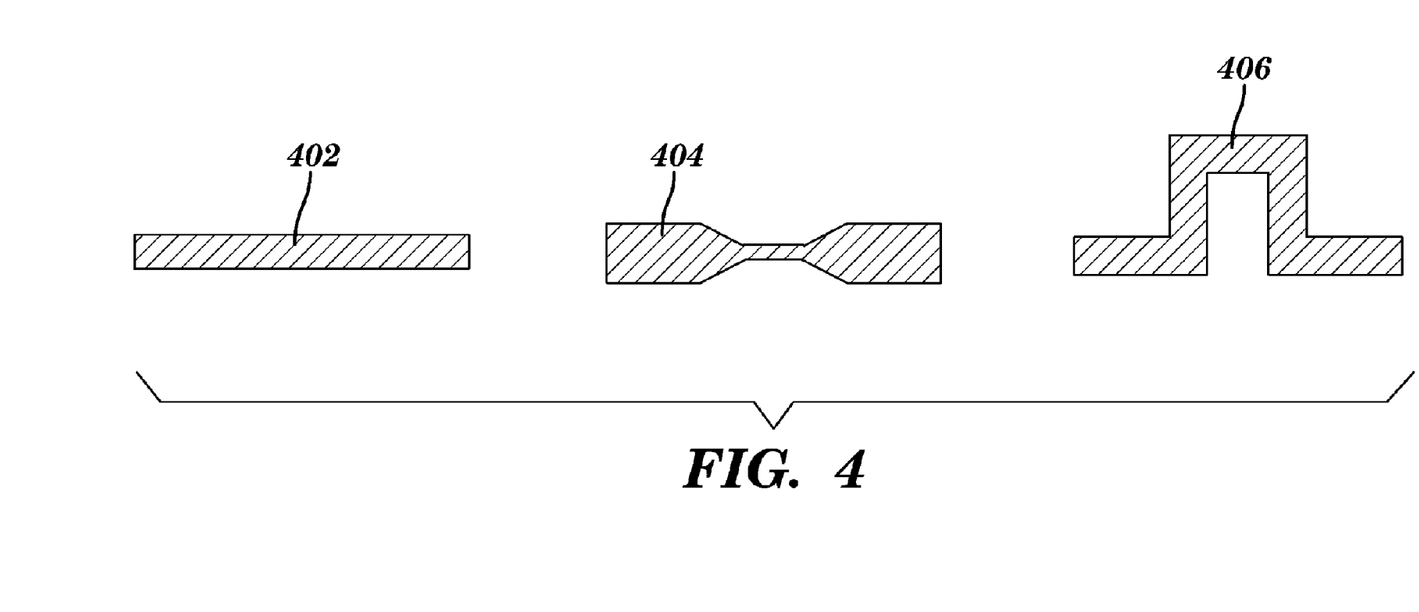
FIG. 4 is a diagram illustrating exemplary fuse link shapes.

Fuse link 308 is the section of fuse 302 that heats up and breaks when a sufficient amount of current flows through the fuse. Preferably, fuse link 308 comprises polysilicon. Alternatively, fuse link 308 can comprise any suitable material such as amorphous silicon, epitaxial silicon, silicon germanium alloy in any phase, or the like. Alternatively, a silicide can be formed on the underlying fuse link material to increase the conductivity of the fuse. The silicide, or silicide-germanide alloy, can comprise any suitable metal such as tungsten, cobalt, titanium, tantalum, nickel, or the like. Fuse link 308 can be of any suitable shape. For example, as illustrated in FIG. 4, fuse link 308 can be straight 402, necked 404, or folded 406. For illustrative purposes only, fuse link 308 of FIG. 3 is straight.

Preferably, a diodic circuit component is integrated into each fuse of the dense fuse array to prevent parasitic currents. Fuse arrays that are 100% resistive typically have parasitic currents. Contacts to the anodes and cathodes can be formed asymmetrically to induce diodic effects according to Schottky diode principles. To induce diodic effects in each fuse, either the anode/cathode of the fuse can be doped appropriately to create a p-n junction diode effect or the contacts to the anode/cathode can be silicided appropriately to create a Schottky diodic effect, or both. Schottky and p-n diodes are well known in the art and are formed by placing in contact two materials having different work functions. Schottky diodes are formed by placing a metal in contact with a semiconductor material. Most metals have a higher work function than do most semiconductor materials. Diodes of the p-n type are formed by placing p-type semiconductor material in contact with n-type semiconductor material. With proper biasing, both types of diodes can conduct current.

FIGS. 5A–5E illustrate exemplary integrated diode/fuse structures having a p-n junction diodic effect, a Schottky diodic effect, or both. The exemplary integrated diode/fuse structures illustrated in FIGS. 5A–5E can be used as the fuse elements in the dense semiconductor fuse array of the present invention.

Figure 5A:
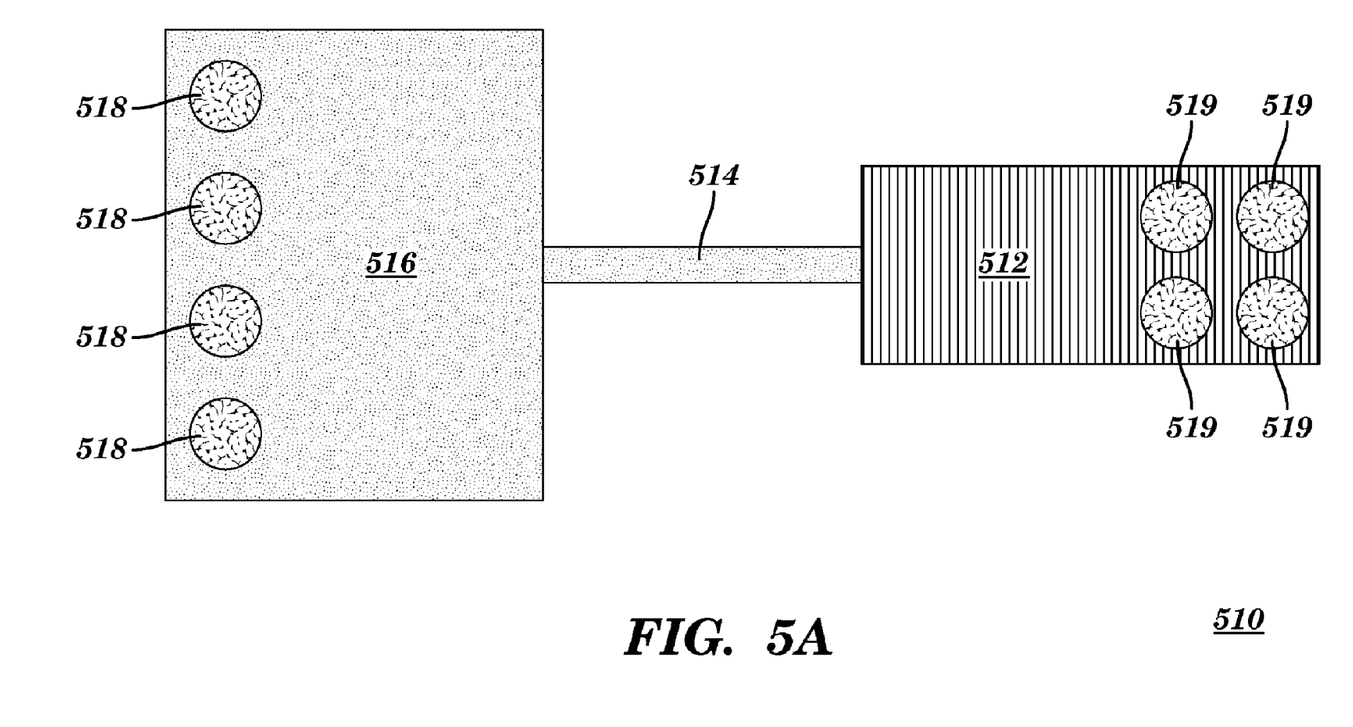
FIG. 5A is a diagram illustrating an integrated diode/fuse structure having an anode and cathode doped with different dopant species according to an embodiment of the present invention.

FIG. 5A illustrates fuse 510 having anode 512, fuse link 514, and common cathode 516 where the anode and cathode are doped with different species to induce diodic effects. Anode 512, fuse link 514, and common cathode 516 all preferably have silicide formed thereon. Anode 512 is doped with an n-type dopant species such as Phosphorous or Arsenic and fuse link 514 and common cathode 516 are doped with a p-type dopant species such as Boron. Cathode contacts 518 and anode contacts 519 are preferably silicided. Cathode contacts 518 and anode contacts 519 can be formed from any suitable material such as doped or undoped polysilicon. Since the p-type silicon and n-type silicon have different work functions, diodic circuit behavior can be induced within the fuse.

The fuse embodiment previously described in accordance with FIG. 5A allows for the elimination of one level of metal wiring for the common cathode lines of the dense fuse array of the present invention since cathode contacts 518 can be made at the end of each common cathode line such as common cathode lines 306A, 306B, 306C, 306D, 306E, and 306F of FIG. 3 The cathode contacts need not be placed in proximity to each fuse because the p-n diodic component is formed at the junction between the n-type anode 512 and the p-type fuse link 514. Alternatively, if an additional metal line is run over the cathode, for example, for lowering metal line resistance, the cathode contacts can be placed in proximity to each fuse.

Figure 5B:
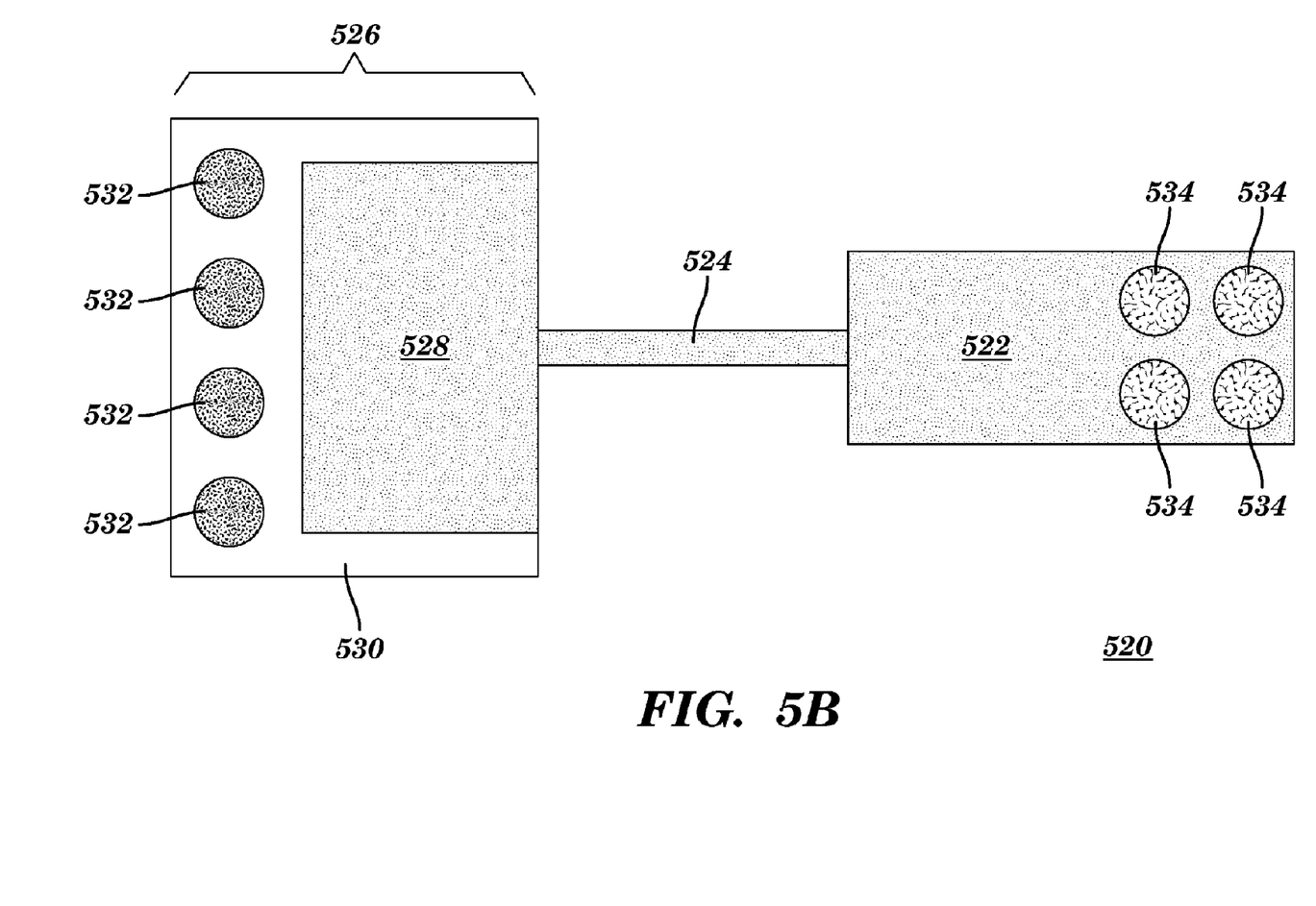
FIG. 5B is a diagram illustrating an embodiment of an integrated diode/fuse structure having silicided anode contacts and un-silicided cathode contacts according to an embodiment of the present invention.

FIG. 5B illustrates fuse 520 having anode 522, fuse link 524, and common cathode 526 where the silicide concentration of the anode and cathode contacts are different to induce diodic effects. Cathode contacts 532 and anode contacts 534 can be formed from any suitable material such as doped or undoped polysilicon. Anode 522, fuse link 524, and common cathode 526 have the same doping type (e.g. p-type dopant species such as Boron). Anode 512 and fuse link 514 have silicide formed over their entire structures, respectively, while common cathode 526 is only partially silicided. Common cathode 526 has a silicided region 528 and an un-silicided region 530. Cathode contacts 532 are formed in un-silicided region 530. Thus, cathode contacts 532 do not have silicide formed thereon. Since the presence or absence of silicide at the node contacts affects the band gap shape, different silicide concentrations for the anode and cathode contacts can induce diodic behavior within the fuse. For example, only one terminal, either the cathode or the anode, can be silicided while the other terminal is not silicided. As illustrated in FIG. 5B, anode 522 and anode contacts 534 are silicided and cathode contacts 532 are not silicided.

The fuse embodiment previously described in accordance with FIG. 5B does not allow for the elimination of one level of metal wiring for the common cathode lines of the dense fuse array of the present invention since cathode contacts 532 must be in proximity to each fuse element. Thus, cathode contacts 532 cannot be placed solely at the end of each common cathode line as is the case with fuse 510 of FIG. 5A because the Schottky diodic circuit component is integrated at the cathode side of each fuse, where the diode is formed at the junction between the silicided region 528 and the un-silicided region 530 of cathode 526.

Figure 5C:
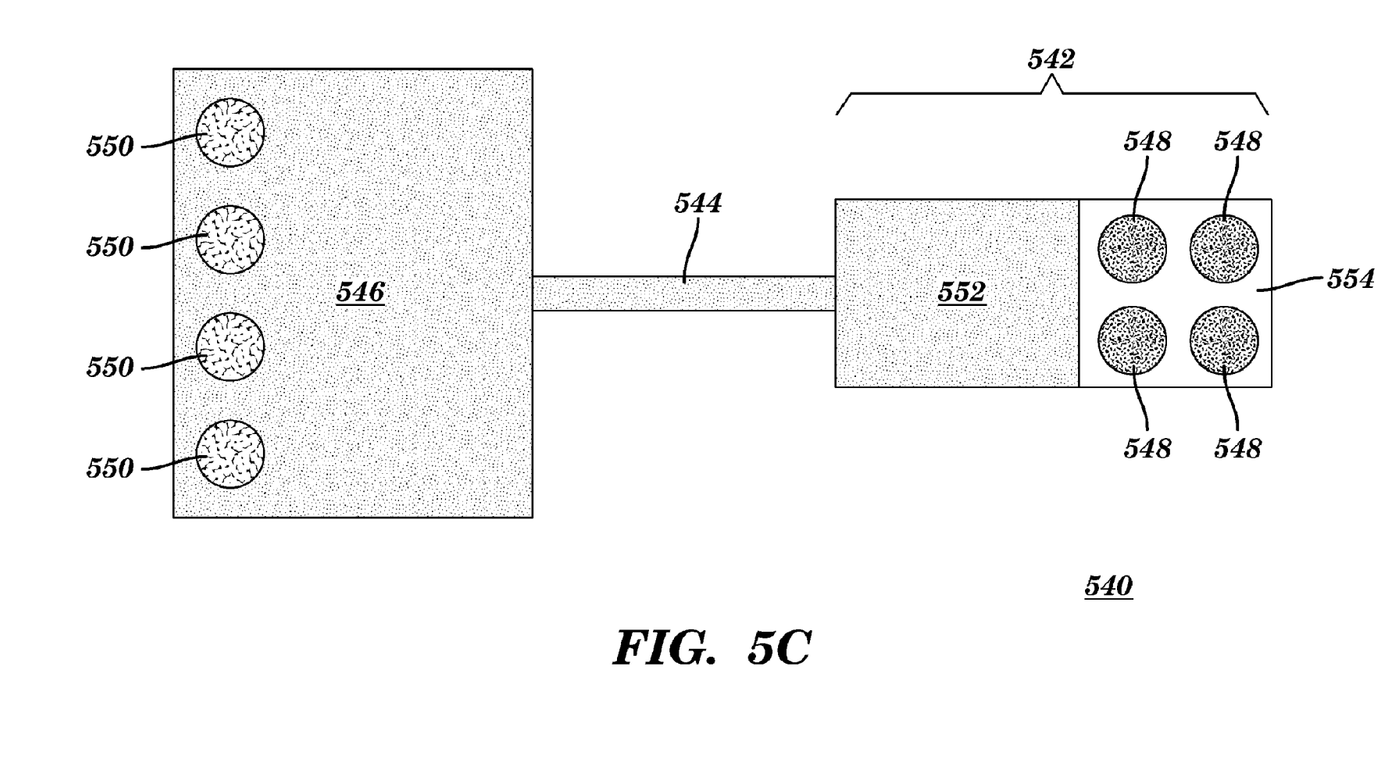
FIG. 5C is a diagram illustrating an embodiment of an integrated diode/fuse structure having un-silicided anode contacts and silicided cathode contacts according to an embodiment of the present invention.

Alternatively, FIG. 5C illustrates fuse 540 having anode 542, fuse link 544, and common cathode 546 where anode contacts 548 are not silicided and cathode contacts 550 are silicided. Cathode contacts 550 and anode contacts 548 can be formed from any suitable material such as doped or undoped polysilicon. Anode 542 comprises a silicided region 552 and an un-silicided region 554. Un-silicided anode contact 548 reside in un-silicided region 554 of anode 542.

The fuse embodiment previously described in accordance with FIG. 5C allows for the elimination of one level of metal wiring for the common cathode lines of the dense fuse array of the present invention since cathode contacts 550 can be made at the end of each common cathode line such as common cathode lines 306A, 306B, 306C, 306D, 306E, and 306F of FIG. 3. The cathode contacts need not be placed in proximity to each fuse because the Schottky diodic component is formed at the junction between the silicided region 552 and the un-silicided region 554 of anode 542. Alternatively, if an additional metal line is run over the cathode, for example, for lowering metal line resistance, the cathode contacts can be placed in proximity to each fuse.

Alternatively, diodic effects can be induced in fuses by both doping the anode/cathode of the fuse appropriately to create p-n junction diodic effects and by differing the silicide concentration of the anode/cathode contacts appropriately to create Schottky diodic effects. By combining both techniques (different anode/cathode dopant concentration and different silicide concentration of the anode/cathode contacts) the effectiveness of the diode formed within each fuse can be amplified, where the effectiveness of a diode is characterized as the diode's ability to prevent current flow when the diode is not forward biased.

Figure 5D:
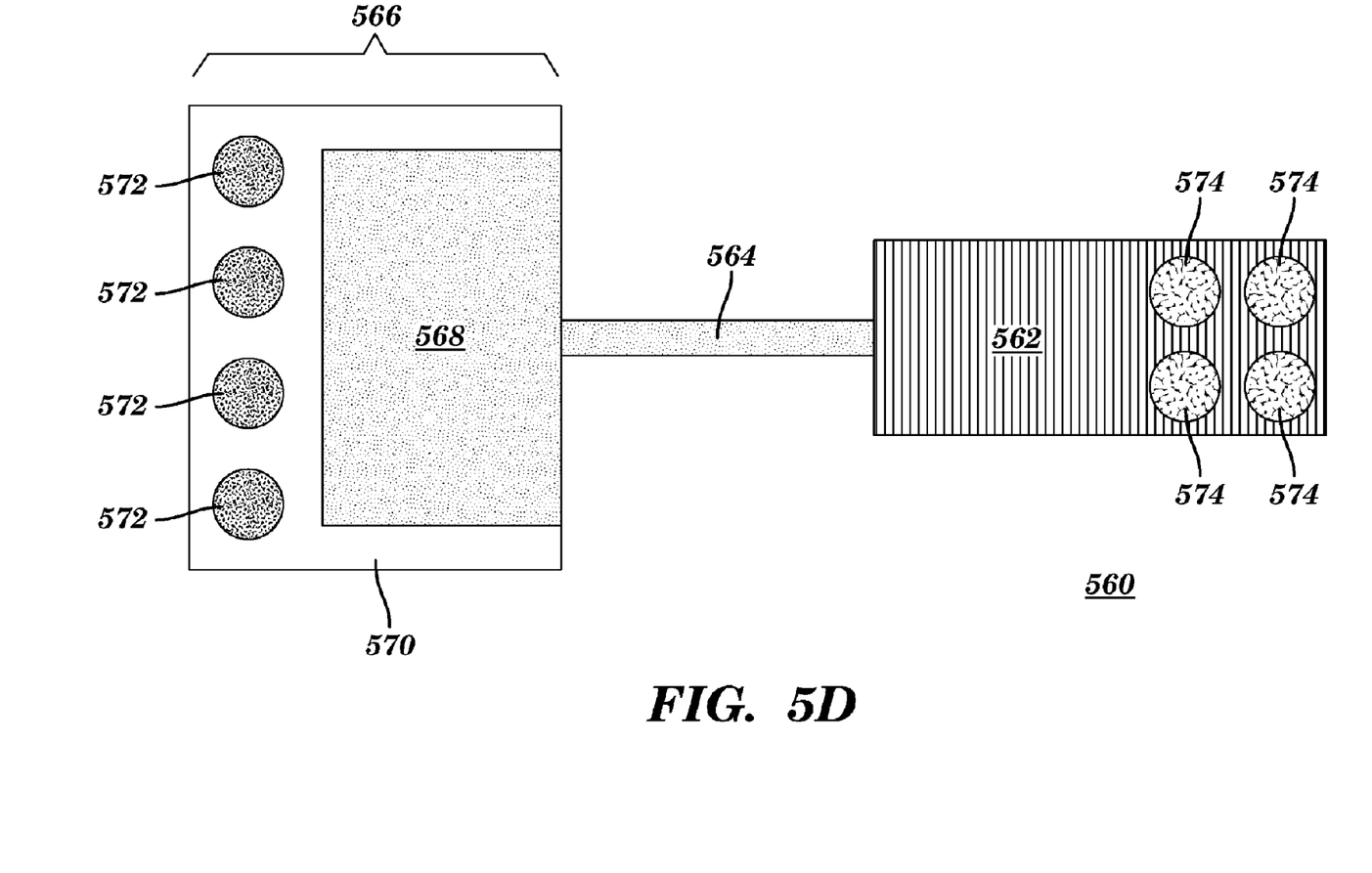
FIG. 5D is a diagram illustrating an embodiment of an integrated diode/fuse structure having an anode and cathode doped with different dopant species, silicided anode contacts, and un-silicided cathode contacts according to an embodiment of the present invention.

For example, FIG. 5D illustrates fuse 560 comprising anode 562, fuse link 564, and common cathode 566. Anode 562 is doped with an n-type dopant species such as Phosphorous or Arsenic and fuse link 564 and common cathode 566 are doped with a p-type dopant species such as Boron. Additionally, common cathode 566 comprises a silicided region 568 and an un-silicided region 570. Cathode contacts 572 reside in un-silicided region 570 of common cathode 566 and are also un-silicided. Anode contacts 574 are silicided. Cathode contacts 572 and anode contacts 574 can be formed from any suitable material such as doped or undoped polysilicon.

The fuse embodiment previously described in accordance with FIG. 5D does not allow for the elimination of one level of metal wiring for the common cathode lines of the dense fuse array of the present invention since cathode contacts 572 must be in proximity to each fuse element. Thus, cathode contacts 572 cannot be placed solely at the end of each common cathode line as is the case with fuses 510 of FIG. 5A and 540 of FIG. 5C because the Schottky diodic circuit component is integrated at the cathode side of each fuse, where the diode is formed at the junction between the silicided region 568 and the un-silicided region 570 of cathode 566.

Figure 5E:
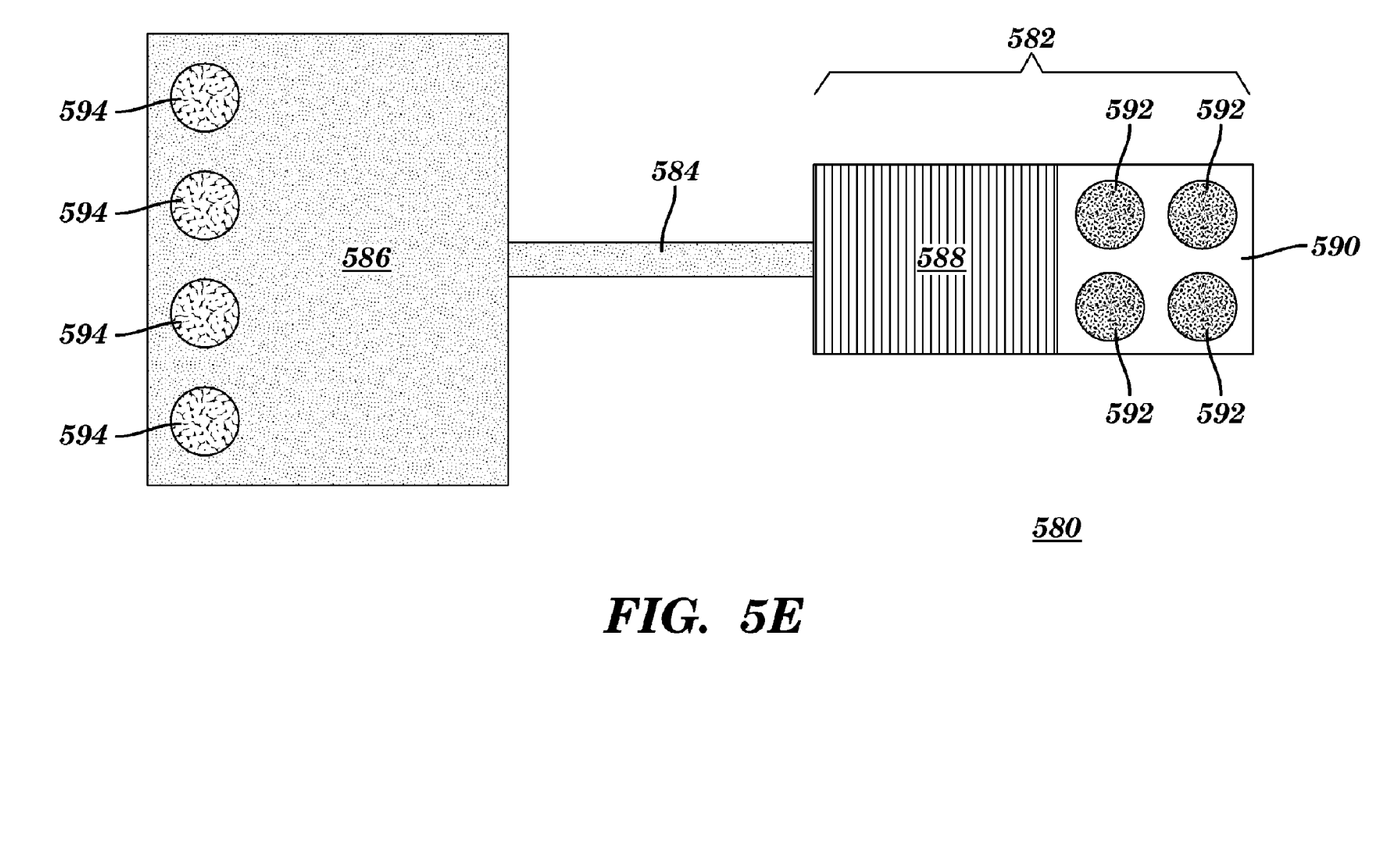
FIG. 5E is a diagram illustrating an embodiment of an integrated diode/fuse structure having an anode and cathode doped with different dopant species, un-silicided anode contacts, and silicided cathode contacts according to an embodiment of the present invention.

Alternatively, FIG. 5E illustrates fuse 580 comprising anode 582, fuse link 584, and common cathode 586. Anode 582 comprises silicided region 588 and un-silicided doped region 590. Anode 582 is doped with an n-type dopant species such as Phosphorous or Arsenic. Common cathode 586 and fuse link 584 are doped with a p-type dopant species such as Boron. Common cathode 586 and cathode contacts 594 are silicided. Cathode contacts 594 and anode contacts 592 can be formed from any suitable material such as doped or undoped polysilicon. The direction, or polarity, of the built-in diode is determined such that the direction of the current flow is consistent with the programming, i.e., flow of current from the cathode to anode.

The fuse embodiment previously described in accordance with FIG. 5E allows for the elimination of one level of metal wiring for the common cathode lines of the dense fuse array of the present invention since cathode contacts 594 can be made at the end of each common cathode line such as common cathode lines 306A, 306B, 306C, 306D, 306E, and 306F of FIG. 3. The cathode contacts need not be placed in proximity to each fuse because the p-n diodic component is formed at the junction between the n-type anode 582 and the p-type fuse link 584 and the Schottky diodic component is formed at the junction between the silicided region 588 and the un-silicided region 590 of anode 582. Alternatively, if an additional metal line is run over the cathode, for example, for lowering metal line resistance, the cathode contacts can be placed in proximity to each fuse.

Unlike conventional semiconductor fuse arrays where each fuse comprises a separate, individual cathode such as the kind illustrated in FIG. 2, the dense fuse array of the present invention comprises fuses having cathodes that are shared by multiple fuses. Preferably, all fuses in a particular row of the fuse array share a common cathode. It is preferable for all fuses in a particular row to share a common cathode in order to maximize the density of the array. As previously described, fuse array layouts must adhere to minimum ground rule spacing requirements for adjacent fuses. Since the individual cathodes of each fuse of a conventional fuse array must be separated by a minimum amount of space, the density of the fuse array can be improved by having multiple fuses share a common cathode.

Returning to FIG. 3, common cathode 306A of dense fuse array 300 is shared by the sixteen fuses, each fuse having a fuse link coupled to common cathode 306A. As such, common cathode 306A functions as both a row line of the dense fuse array and as a cathode for those fuses connected to the common cathode. As illustrated in FIG. 3, fuses located both above and below a particular common cathode can share that cathode to optimize fuse array density. Alternatively, a subset of fuses in a particular row can share a common cathode.

Common cathodes 306A–306F can be formed in a device layer (e.g. transistor layer) below the first metal layer. The common cathodes can be formed from a contiguous conducting layer such as polysilicon and function as cathodes for each fuse of the fuse array. Common cathodes 306A–306F eliminate the need for individual cathodes and the ground rule spacing requirements associated with adjacent individual cathodes, thus optimizing the density of fuse array 300. Also, when the diodic circuit component of a fuse is not incorporated on the cathode side, such as in FIGS. 5A, 5C, and 5E, common cathodes 306A–306F function as row lines (e.g. wires) by providing electrical connections between row access circuit 330 and the array fuses. In this case, wiring of the cathodes with additional metal lines is optional but not required, allowing for the elimination of one metal wiring layer over the fuse array.

Anode 304 is connected to conductor 310 by a conductive contact (not shown) such as Tungsten or polysilicon. Conductor 310 is connected to conductive wire 312. Conductor 310 and conductive wire 312 can be formed from any suitable conductive material such as aluminum or copper. Wiring layer 314, which includes a plurality of conductive wires such as conductive wire 312, can be formed in a first metal layer and function as column lines (e.g. wires) by providing electrical connections between column access circuit 320 and the anodes of each fuse. Wiring layer 314 can be formed from any suitable conductive material such as aluminum or copper. Column access circuit 320 comprises a plurality of column access transistors for selecting fuses in a particular column. The column access transistors can be any suitable switch for selecting fuses. A particular column access transistor provides a switchable connection between circuitry coupled to the column access transistor (not shown) and the fuse anodes coupled to a particular conductive wire (e.g. column line). For example, column access transistor 340 provides a switchable connection to those fuse anodes coupled to conductive wire 312 such as anode 304 of fuse 302. Wiring layer 314 must be insulated from the common cathodes by a suitable insulator, otherwise, dense fuse array 300 cannot function properly.

Row access circuit 330 comprises a plurality of row access transistors for selecting fuses in a particular row. The row access transistors can be any suitable switch for selecting fuses. A particular row access transistor provides a switchable connection between circuitry coupled to the row access transistor (not shown) and the fuses coupled to a particular common cathode (e.g. row line). For example, row access transistor 350 provides a switchable connection to those fuses coupled to common cathode 306A such as fuse 302.

By activating certain column and row access transistors, column access circuit 320 and row access circuit 330 can select an individual fuse for programming or sensing. For example, when column access transistor 340 and row access transistor 350 are activated (i.e. switched 'on' so that current can flow through the channel region of the access transistors) fuse 302 is selected and can be either programmed by driving a sufficient amount of current through fuse link 308 or can be sensed by suitable sense circuitry. The array sense circuitry can be coupled to column access circuit 320, row access circuit 330, or some suitable combination of both. Fuse array sense circuits and techniques for sensing are well known in the art, and as such, no further description is warranted. Any suitable array sense circuitry can be used in conjunction with the present invention.

Common cathodes 306A–306F optimize fuse array density as compared to conventional semiconductor fuse arrays. For example, dense fuse array 300 of FIG. 3 occupies 38% less area than a comparable conventional fuse array having individual cathodes for each fuse (5.73 um$^2$ per fuse versus 9.2 um$^2$, respectively).

Additionally, when the diodic circuit component of the fuse is not incorporated on the cathode side of the fuse, such as illustrated in FIGS. 5A, 5C, and 5E, common cathodes 306A–306F eliminate the need for a separate metal wiring layer for making electrical connections to fuse cathodes in the proximity of each fuse. Because the common cathodes function as both common cathodes and row lines, row access circuitry can be coupled directly to the common cathodes, thus eliminating the need for an additional wiring layer.

In general, the dense semiconductor fuse array according to the present invention having n row lines and m column lines occupies approximately 42% less area than a comparable conventional fuse array having individual cathodes. For a n×m semiconductor fuse array, the total area occupied by a conventional fuse array having individual cathodes for each fuse is: n×m×9.2 um$^2$ and the total area occupied by the dense fuse array according to the present invention is: (n×5.3 um+2.6 um)×(m×1 um). The per fuse area of a conventional fuse array is 9.2 um$^2$ and the per fuse area of a dense fuse array according to the present invention is 5.3 um$^2$. Therefore, the dense semiconductor fuse array of the present invention occupies only approximately 58% of the area occupied by a conventional fuse array (e.g. 42% reduction in area).

Dense fuse array 300 can be programmed or sensed in response to column access circuit 320 and row access circuit 330. To select a particular fuse, the column and row access transistors associated with that fuse are activated. To program the selected fuse, a sufficient amount of current is applied to the fuse link of the selected fuse, thereby heating and subsequently breaking the fuse link of the fuse. For example, to program fuse 302 of dense fuse array 300, column access transistor 340 and row access transistor 350 are activated. All other row and column access transistors are turned off (e.g. high Z impedance state). Column access transistor 340 provides a voltage potential to anode 304 of fuse 302 via conductive wire 312 and conductor 310 and row access transistor 350 provides ground potential to fuse 302 via common cathode 306A. A sufficient amount of current can then flow through fuse 302, thereby heating and subsequently breaking fuse link 308. Each fuse can be uniquely programmed by selecting the appropriate row and access transistor and driving a sufficient amount of current through the activated fuse. Sense circuitry (not shown) can be coupled to dense fuse array 300 and can detect whether a selected fuse has been programmed. As with fuse programming, all row and column access transistors are turned off (e.g. high Z impedance state) except for the row and column access transistor associated with the fuse to be sensed. When sensing the state of a selected fuse, the amount of maximum current is limited, for example by lowering gate voltages on access transistors or by other suitable means, to minimize electromigration if the selected fuse was not programmed prior to sensing. The current level flowing through the access transistors determines the state of the selected fuse (e.g. either programmed or un-programmed), and thus, sensing is accomplished.

The diodic circuit component of each fuse eliminates the secondary current paths during programming and sensing. In a purely resistive array circuit, when a row and column are selected to enable a current path, the neighboring circuit elements and wires form a network for secondary current. For each of the diodic circuit components described previously in accordance with FIGS. 5A–5E, the secondary current problem is solved.

Figure 6:
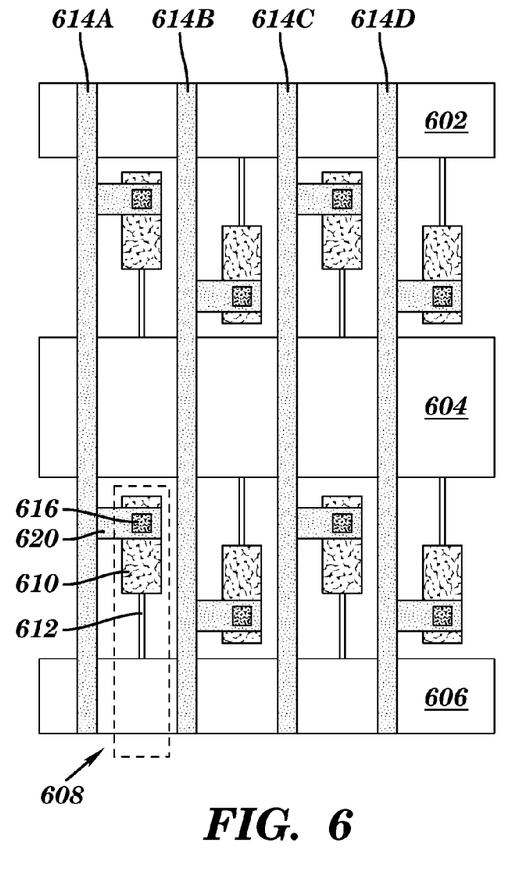
FIG. 6 is an enlarged planar view of a section of the dense semiconductor fuse array illustrated in FIG. 3.

FIG. 6 illustrates an enlarged planar view of section 360 of dense fuse array 300 of FIG. 3. Section 360 of FIG. 6 can incorporate any suitable diodic component such as the diodic circuit components previously described in accordance with FIG. 5A, 5C, or 5E. For the diodic circuit components previously described in accordance with FIGS. 5B and 5D, additional metal wiring to the cathode is required because the diodic circuit component is integrated on the cathode side of each fuse as previously described. Section 360 contains eight fuses. Common cathodes 602, 604, and 606 function as both row lines and common cathodes for multiple fuses as previously described. Each fuse comprises a common cathode, an anode, and a fuse link. For example, fuse 608 comprises common cathode 606, anode 610, and fuse link 612. Each fuse is electrically connected to a column access transistor (not shown) by one of conductive wires 614A–614D (e.g. column lines). For example, fuse 608 is connected to a column access transistor by conductive wire 614A. Anode 610 of fuse 608 is connected to conductive wire 614A by conductive contact 616 and conductor 620. Conductive contact 616 extends downward from a bottom surface of conductor 620 to an upper surface of anode 610. Each fuse is electrically connected to a row access transistor (not shown) by a common cathode. For example, fuse 608 is electrically connected to a row access transistor by common cathode 606. Fuse link 612 of fuse 608 can be programmed or sensed as previously described by applying sufficient current to the fuse link.

The dense semiconductor fuse array according to the present invention can be incorporated into circuits such as programmable circuits. For example, the dense semiconductor fuse array according to the present invention can be incorporated into Programmable Read Only Memory (PROM) circuits. A PROM can be programmed once after its manufacture. In one type of PROM, an array of memory cells can be programmed by opening or "blowing" one or more fuse links. A fuse link is programmed by driving sufficient current through the fuse link until the fuse link breaks, or opens. Alternatively, the dense semiconductor fuse array according to the present invention can be incorporated into any suitable integrated circuit requiring programmable fuses. For example, the dense fuse array according to the present invention can be incorporated into integrated circuits to perform a number of functions such as: forming alterable circuit connections; replacing defective circuit elements with redundant circuit elements; activating security features; or forming a once-programmable memory circuit.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor fuse arrangement, comprising:
a plurality of electrical conductors;
a common cathode insulated from the plurality of electrical conductors; and
a plurality of fuses, each fuse having an anode coupled to a fuse link, each anode being coupled to one of the plurality of electrical conductors, at least two fuse links being disposed along a row of fuses and being coupled to the common cathode, an additional fuse of the plurality being disposed along the row and intermediately of the at least two fuse links, the fuse link of the additional fuse being coupled to an additional common cathode electrically insulated from the common cathode.

2. The semiconductor fuse array of claim 1, further comprising an access circuit coupled to the plurality of electrical conductors, adapted to select one of the plurality of electrical conductors.

3. The semiconductor fuse array of claim 2, wherein the access circuit comprises a plurality of transistors.

4. The semiconductor fuse array of claim 1, wherein the common cathode, anodes and fuse links comprise a material selected from the group consisting of polysilicon, amorphous polysilicon, amorphous silicon, epitaxial silicon, and silicon germanium alloys.

5. The semiconductor fuse array of claim 1, wherein the fuse links are formed in accordance with a shape selected from the group consisting of straight, necked, and folded.

6. The semiconductor fuse array of claim 1, further comprising a silicide layer formed on the common cathode, anodes, and fuse links.

7. The semiconductor fuse array of claim 1, further comprising a plurality of conductive contacts, each anode being coupled to at least one of the plurality of conductive contacts and the common cathode being coupled to at least one of the plurality of conductive contacts, wherein the anodes and common cathode are not coupled to the same conductive contacts.

8. The semiconductor fuse array of claim 7, wherein each anode is doped with a first dopant and the common cathode is doped with a second dopant.

9. The semiconductor fuse array of claim 8, further comprising a suicide layer formed on the common cathode, anodes, fuse links, and conductive contacts.

* * * * *